United States Patent [19]

Hasler

[11] Patent Number: 4,618,829
[45] Date of Patent: Oct. 21, 1986

[54] BRIDGE CIRCUIT DEMODULATOR

[75] Inventor: Rudolf Hasler, Vienna, Austria

[73] Assignee: U.S. Philips Corporation, New York, N.Y.

[21] Appl. No.: 693,434

[22] Filed: Jan. 22, 1985

[30] Foreign Application Priority Data

Jan. 20, 1984 [AT] Austria ................. 189/84

[51] Int. Cl.$^4$ ............................................. H03D 3/00
[52] U.S. Cl. ................................. 329/103; 329/129; 329/145
[58] Field of Search ............... 329/103, 110, 129, 145, 329/192

[56] References Cited

U.S. PATENT DOCUMENTS 3,588,721 6/1971 Keller .................................. 329/129

*Primary Examiner*—Eugene R. LaRoche
*Assistant Examiner*—Robert J. Pascal
*Attorney, Agent, or Firm*—Thomas A. Briody; Jack Oisher; William J. Streeter

[57] ABSTRACT

A bridge circuit demodulator for frequency-modulated signals includes a parallel resonant circuit tuned to the carrier frequency of the FM signals. The resonant circuit includes the secondary winding of a transformer which is strongly coupled to the secondary winding. The signal to be demodulated is applied to the primary winding. Further, the signal to be demodulated is also applied to an LC phase shift circuit which shifts the signal applied to it through 90°. The phase shift circuit has an output terminal connected to a center tap of the secondary winding and an input connected to receive the signal to be demodulated. The parallel resonant circuit and the phase shift circuit constitute the diagonals of the bridge circuit constituting the demodulator. The FM signal is applied to the phase shift circuit and to the parallel resonant circuit through separate outputs of a difference amplifier. The phase shift and parallel resonant circuits are thus isolated from one another so that changes in the phase or tuning of one do not affect the phase or tuning of the other.

9 Claims, 4 Drawing Figures

BRIDGE CIRCUIT DEMODULATOR

BACKGROUND OF THE INVENTION

Field of the Invention

The invention relates to demodulators in bridge circuit configuration for frequency-modulated signals which comprise a parallel resonant circuit tuned to the carrier frequency of these signals and constituting one diagonal of the bridge circuit, the parallel resonant circuit being coupled to a signal source producing the signal to be demodulated via a primary winding. A second parallel circuit constitutes the other bridge diagonal and receives a voltage which is phase-shifted through 90° relative to the voltage at the first parallel resonant circuit. Demodulators of this type are generally known as quotient demodulators, alternatively denoted as ratio detectors, or as phase demodulators. To generate the voltage to be coupled into the second bridge diagonal of such a demodulator it is customary to provide a further winding, alternatively designated the tertiary winding, which is strongly coupled, i.e. coupled with a relatively high coupling coefficient, to the primary winding of the first parallel resonant circuit, while a weak coupling is provided between the primary winding and the first parallel resonant circuit, as a result of which the desired 90° phase shift is obtained between the voltage across the first parallel resonant circuit and the voltage coupled into the last mentioned bridge diagonal. Such a three-winding arrangement is comparatively expensive and the required, different coupling coefficients can only be implemented by the mechanical construction of the arrangement of the windings, so that the resultant coupling coefficients are comparatively tolerance-dependent and in the case of an inductive tuning of the parallel resonant circuit, which is the most customary way of tuning the resonant circuit, also dependent on the position of the ferromagnetic core within the windings, this position being variable for the purposes.

SUMMARY OF THE INVENTION

The invention has for its object to eliminate the above-mentioned disadvantages and to provide a particularly simple construction of the demodulators of the type set forth in the opening paragraph.

According to the invention, this is accomplished in that the primary winding is strongly coupled to the parallel resonant circuit, that an LC-phase shifting network is provided for forming the voltage whose phase is shifted through 90° relative to the voltage across the parallel resonant circuit and that the voltage applied to the primary winding of the parallel resonant circuit and the voltage applied to the LC-phase-shifting network are produced by signal sources which are independent of each other as regards their phases. Thus, no third winding is required, which results in a simpler construction, and moreover the coupling between the primary winding and the parallel resonant circuit is not subjected to mechanical tolerances or changes during an inductive tuning of the parallel resonant circuit because of the fact that the coupling is now a mechanically fixed coupling and finally it is also very simple to recover the 90° phase-shifted voltage as the desired phase shift can be realized with the aid of discrete circuit elements.

As regards the recovery of the voltage applied to the primary winding of the parallel resonant circuit and the voltage applied to the LC-phase shifting network from signal sources which as regards their phases are independent of each other, there are several modes of implementation. Thus, it is, for example, possible to include the primary winding in the output circuit of an amplifier, which in addition comprises a load resistor, from which the LC-phase shifting network is fed. It proved to be particularly simple when the signal sources, which are independent from each other as regards their phases are constituted by the two outputs of a differential amplifier. In this way it is accomplished that no cross coupling occurs between the voltages which are applied on the one hand to the primary winding of the parallel resonant circuit and on the other hand to the LC-phase shifting network, an additional advantage being that differential amplifiers of such a type are usually included on a large scale in integrated circuits provided for the purpose of processing frequency-modulated signals.

There are also several possibilities for the structure of the LC-phase shifting network. It may, for example, be arranged as a low-pass filter, a 90° phase shift then occurring between its input and output signals at the cut-off frequency of the low-pass filter. However, in practice it has been found to be very advantageous when the LC-phase shifting network is in the form of a high-pass filter with a capacitor at its output. In this way it is namely possible to employ the coil of the high-pass filter, which coil constitutes the inductance, also as a direct current path for the two demodulator bridge branches which comprise the rectifier.

The invention will now be described in greater detail by way of example with reference to the accompanying drawings which show circuit diagrams of embodiments of the invention, the invention however not being limited to these embodiments.

DESCRIPTION OF THE PREFERRED EMBODIMENTS

Figure 1:
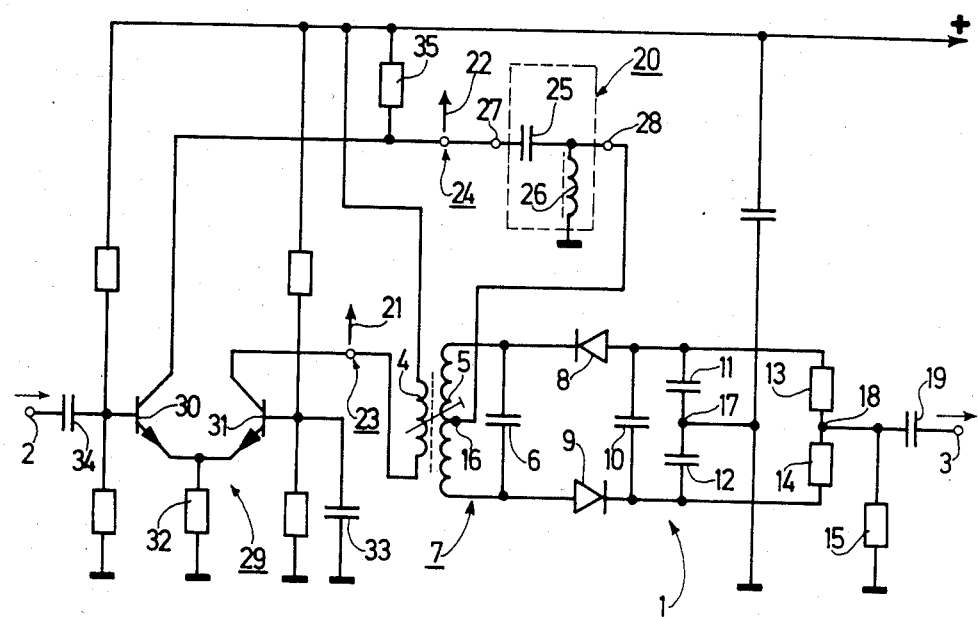
FIG. 1 shows a ratio detector and a LC-phase shifting network in the form of a high-pass filter with a capacitor at its input, this phase-shifting network and the primary winding of the parallel resonant circuit of the ratio detector each being fed from the two outputs of a differential amplifier.

In the circuit diagram shown in FIG. 1, reference numeral 1 denotes a demodulator in bridge circuit configuration, here in the form of a ratio detector, such as for example, employed in radio receivers for demodulating a carrier signal which is frequency-modulated with a baseband modulation signal. The carrier signal is applied to the circuit arrangement as an intermediate frequency signal via an input 2, and the base band modulation signal is then available at an output 3 for further processing. As is customary, the ratio detector includes a parallel resonant circuit 7 with coupled primary and secondary windings 4 and 5 and a capacitor 6, two rectifiers 8 and 9, a charging capacitor 10, two filter capacitors 11 and 12, two load resistors 13 and 14 and a terminating resistor 15. These circuit elements are connected in known manner in a bridge circuit arrangement, one bridge diagonal 16, 17 connecting a centre tap 16 provided at the secondary winding 5 to a junction 17 between the two filter capacitors 11 and 12 and the other bridge diagonal being formed by the parallel resonant circuit 7. The signal to be demodulated is applied to the bridge diagonal formed by the parallel resonant circuit 7 via the primary winding 4, whereas a voltage which is shifted through 90° relative to the voltage at the parallel resonant circuit 7 is coupled into the bridge diagonal 16, 17. The demodulated useful base band signal is produced at a junction 18 between the two load resistors 13 and 14, from which it is conveyed to the output 3 via an isolating capacitor 19. The operating mode of such a ratio detector need not to be described in further details as it is generally known.

For such a ratio detector measures have now been taken to provide that the primary winding 4 is strongly coupled to the secondary winding 5 of the parallel resonant circuit 7, that for forming the voltage which is shifted through 90° relative to the voltage at the parallel resonant circuit 7 a LC-phase-shifting network 20 is provided and that the voltage applied to the primary winding 4 of the parallel resonant circuit 7 and denoted by an arrow 21, and the voltage applied to the LC-phase-shifting network 20 and denoted by an arrow 22 are obtained from signal sources 23 and 24 which, as regards their phases, are independent of each other. In this way the voltage, whose phase is shifted through 90° relative to the voltage across the parallel resonant circuit 7 and is fed into the bridge diagonal 16, 17 is produced by separate discrete circuit elements, so that the desired phase shift can be accurately determined. In addition, because of the fact that the voltage at the primary winding 4 of the parallel resonant circuit 7 and the voltage at LC-phase shifting network 20 are obtained from signal sources which as regards their phases are independent of each other, cross-coupling between the voltage across the parallel resonant circuit and the voltage fed into the bridge diagonal 16, 17 cannot occur, so that in the main the procedure of demodulating the frequency-modulated signal proceeds accurately and the useful signal is obtained correctly, the more so as the primary winding at the parallel resonant circuit is now strongly coupled, so that no changes in the coupling provided between the windings 4 and 5 are caused by tolerances during the manufacture of the winding 4 and 5 and at an inductive tuning of the parallel resonant circuit 7.

In the present embodiment the LC-phase-shifting network 20 is formed by a capacitor 25 and a coil 26, which are here connected as a high-pass filter, the capacitor 25 being connected to an input 27 of the high-pass filter, the junction of the capacitor 25 and the coil 26 forms an output 28 of the high-pass filter and the other end of the coil being connected to the reference potential. The capacitance of the capacitor 25 and the inductance of the coil 26 are chosen such that the cut-off frequency of the high-pass filter corresponds to the carrier frequency of the frequency-modulated signal, which for this signal results in a phase-shift through 90° between the voltage applied to the input 27 of the high-pass filter and the voltage present at the output 28 of the high-pass filter. To feed the output signal of the high-pass filter into the bridge diagonal 16, 17, the output 28 thereof is connected to the centre tap 16 of the secondary winding 5 of the parallel resonant circuit 7, whereas the junction 17 of the filter capacitors 11 and 12 and the coil 26 of the high-pass filter are connected to reference potential. When the high-pass filter is connected into the circuit in this way its coil 26 is used in combination with the terminating resistor 15 and the respective load resistors 13 and 14 for completing the direct current circuit for the two bridge diagonals comprising the rectifiers 8 and 9, respectively.

Another possibility to couple the output signal of the high-pass filter into the bridge diagonal 16, 17 is that coil 26 and junction 17 of the two filtering capacitors 11 and 12 are not connected to reference potential but that they are jointly connected to junction 18 of the two load resistors 13 and 14, in which case the terminating resistor 15 can be omitted, as the direct current paths for the two bridge branches which comprise the rectifiers 8 and 9, respectively are completed directly via the load resistors 13 and 14, respectively.

To obtain the voltage present across the primary winding 4 of the parallel resonant circuit 7 and the voltage at the LC-phase-shifting network 20 from signal sources 23 and 24, respectively which, as regards their phases are independent of each other, these two signal sources 23 and 24 are in the present embodiment constituted by the outputs of a differential amplifier 29. In customary manner this differential amplifier 29 is formed by two transistors 30 and 31, whose emitters are connected to a common emitter resistor 32 and whose bases are each connected to a d.c. voltage divider, the base of the transistor 31 being connected for alternating current to the reference potential via a capacitor 33 and the base of the transistor 30 being connected for alternating current to the input 2 of the circuit arrangement via an isolating capacitor 34. Obviously, such a differential amplifier can also be constructed in integrated circuit technique. The collectors of transistors 30 and 31 constitute the two outputs of differential amplifier 29, a load resistor 35 being included in the collector circuit of the transistor 30, whereas the primary winding 4 of the parallel resonant circuit 7 is directly connected into the collector circuit of the transistor 31. Thus the voltage drop across load resistor 35 constitutes voltage 22 of signal source 24 and the voltage produced across the primary winding 4 constitutes voltage 21 of signal source 23. As will be obvious, these voltages 21 and 22 from the two signal sources 23 and 24 are to a high degree of certainty independent of each other as regards their phases, as no cross-coupling between these two signals exists. Consequently it is also ensured that always the desired phase shift by 90° between the voltage across the parallel resonant circuit 7 and the voltage at the output 28 of the LC phase shifting network 20 is always present, which is of particular importance for a perfect operation of the ratio detector.

Figure 2:
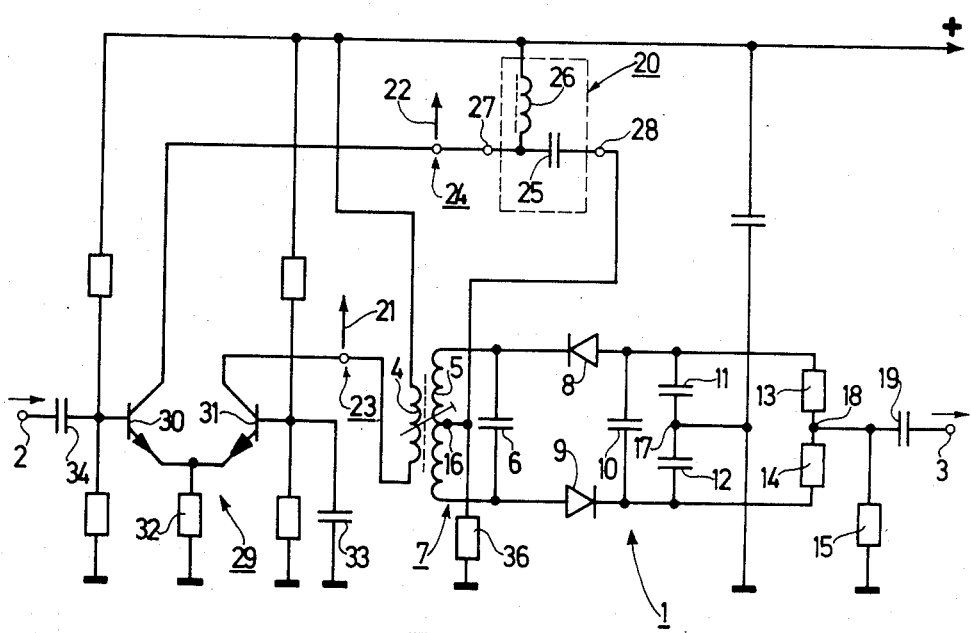
FIG. 2 shows an alternative embodiment of the one shown in FIG. 1, in which the LC-phase-shifting network is in the form of a high-pass filter having an inductance at the input.

In the embodiment shown in FIG. 2, the construction of the circuit arrangement being fundamentally similar to the one as shown in FIG. 1, the LC-phase shifting network 20 is again in the form of a high-pass filter with a capacitor 25 and a coil 26, but here coil 26 is provided at the input 27 of the high-pass and capacitor 25 at the output 28 of the high-pass. In this case, load resistor 35 is no longer required in the collector circuit of the transistor 30 of the differential amplifier 29, as now coil 26 can be included into the collector circuit of this transistor. As now however the direct current paths of the two ratio detector bridge branches comprising the respective rectifiers 8 and 9 can no longer be closed via coil 26 of the high-pass filter, center tap 16 of the secondary winding 5 of the parallel resonant circuit 7 is connected to reference potential via a resistor 36, the two direct current paths then being formed by resistor 36, terminating resistor 15 and the respective load resistors 13 and 14.

Figure 3:
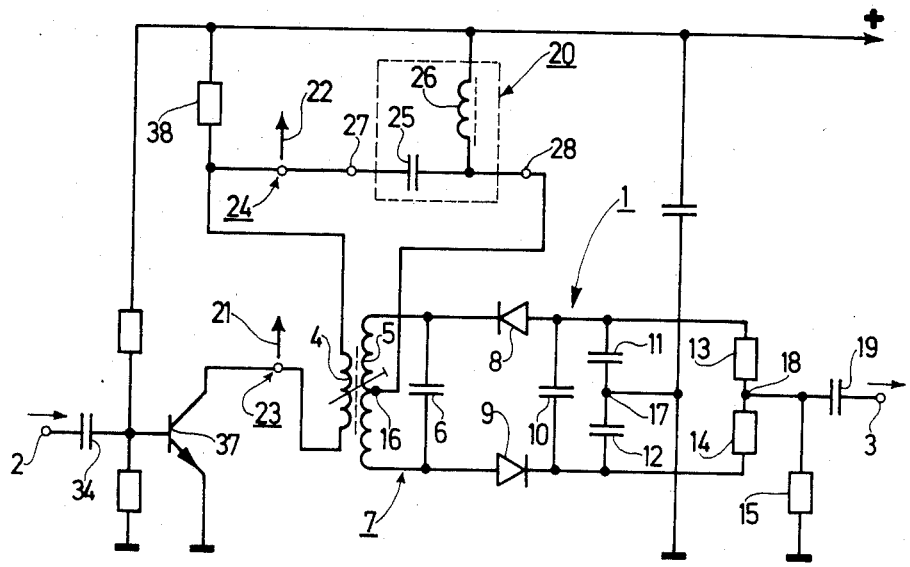
FIG. 3 shows a further alternative embodiment for the one of FIG. 1, in which the LC-phase-shifting network and the primary winding of the parallel resonant circuit of the ratio detector are each fed individually since the primary winding of the parallel resonant circuit and a load resistor, from which the LC-phase-shifting network is fed, are arranged in the output circuit of an amplifying transistor.

The embodiment shown in FIG. 3 illustrates an alternative embodiment for the one shown in FIG. 1, a different implementation of the signal sources 23 and 24 which as regards their phases are independent of each other. Here only one amplifying transistor 37 is provided, whose base is AC-connected to the input 2 of the circuit arrangement. The primary winding 4 of parallel resonant circuit 7 is also here directly included into the collector circuit of this transistor 37, thus forming signal source 23. However, in this situation, the collector circuit of the transistor 37 comprises an additional load resistor 38 arranged in series with primary winding 4, whereby the signal source 23 is formed by the voltage drop across this resistor 38, to which signal source the LC-phase shifting network 20 is connected. As can be seen, here too the two signal sources 23 and 24 are independent of each other as regards their phases, as no cross-coupling exists between the respective voltages 21 and 22, produced by them. It is of course alternatively possible to use a resistor in the emitter circuit of the transistor 37 as signal source 24. In addition, it would alternatively be possible, for example when the LC-phase shifting network 20 is constructed in accordance with the embodiment shown in FIG. 2, to include the series-arrangement of the primary winding 4 of the parallel resonant circuit 7 and the coil 26 of LC-phase shifting network 20 in collector circuit of the transistor 37 or to connect the coil 26 into the emitter circuit of transistor 37.

Figure 4:
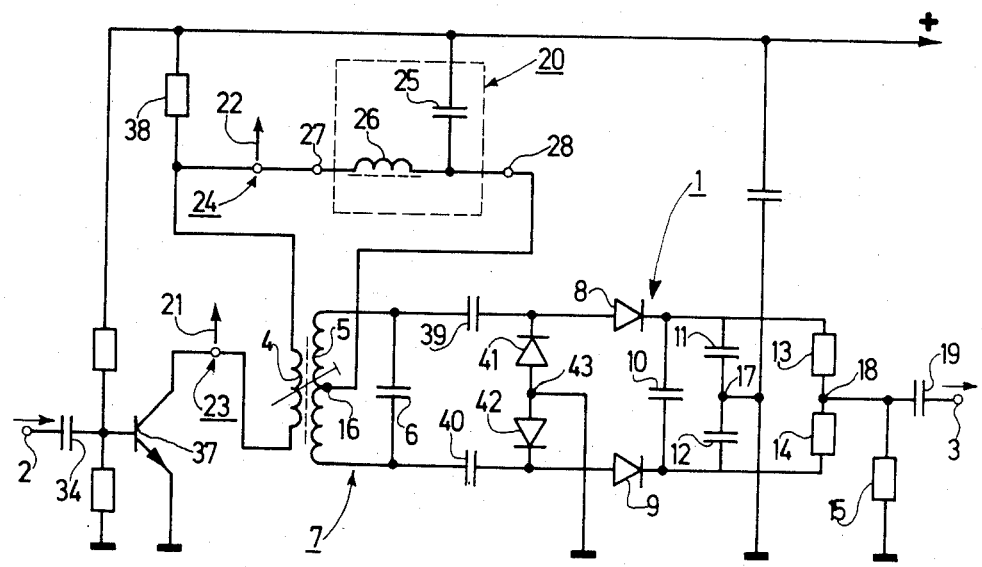
FIG. 4 shows a phase demodulator and a LC-phase-shifting network in the form of a low-pass filter, the type and manner of feeding the primary winding of the parallel resonant network of the phase demodulator and the LC-phase-shifting network being effected in the same way as in the embodiment of FIG. 3.

The embodiment of FIG. 4 shows by way of demodulator 1 a phase demodulator in which, as is known, the two rectifiers 8 and 9 in the two bridge branches are connected with the same polarity or conductive direction. To form the signal sources 23 and 24, which are independent from each other as regards their phases, a circuit arrangement identical to the arrangement shown in the embodiment of FIG. 3 is provided. However, as an LC-phase shifting network a low-pass filter is provided here, which is formed by a capacitor 25 and a coil 26, and whose input 27 is again connected to the signal source 24 and whose output 28 is again connected to the center tap 16 of secondary winding 5 of parallel resonant circuit 7. The capacitance of the capacitor 25 and the inductance of the coil 26 are also here chosen such that the cut-off frequency of the low-pass filter corresponds to the carrier frequency of the frequency-modulated signal, which produces for this signal again a phase shift through 90° between the input and the output of the low-pass filter. Since in the present case the center tap 16 of secondary winding 5 of parallel resonant circuit 7 is connected to a d.c. voltage potential via coil 26, isolating capacitors 39 and 40, respectively are arranged between the parallel resonant circuit 7 and the two rectifiers 8 and 9, respectively, for the purpose of blocking this d.c. potential. The direct current paths for the two demodulator bridge branches comprising the respective rectifiers 8 and 9 then include two further rectifiers 41 and 42, whose junction 43 is connected to reference potential, all this again in association with the terminating resistor 15 and the respective load resistors 13 and 14. It would of course alternatively be possible to provide only one isolating capacitor before or after the low-pass filter, instead of the two isolating capacitors 39 and 40, and to form the direct current paths for the two demodulator bridge branches comprising the respective rectifiers 8 and 9 with a resistor in the path from center tap 16 of secondary winding 5 to reference potential, similar to the connections in the embodiment of FIG. 2, it then being possible to omit the two additional rectifiers 41 and 42.

As can be seen from the foregoing, there are a plurality of alterations of the desired embodiment, without departing from the scope of the invention. This applies more specifically to the implementation of the signal sources which are independent of each other as regards their phases, for producing the voltages to be applied to the primary winding of the parallel resonant circuit and the voltage to be applied to the LC-phase shifting network, as well as to the type and manner in which the voltage whose phase is shifted through 90° relative to the voltage at the parallel resonant circuit is coupled into the relevant bridge diagonal and in what way and manner the direct current circuits for the demodulator bridge branches comprising the rectifiers are completed.

What is claimed is:

1. A demodulator bridge comprising:
   a resonant circuit comprising a secondary winding of a transformer connected in parallel with a resonating capacitance;
   a primary winding of said transformer connected to a signal source of modulated signals for coupling said signals to said resonant circuit;
   an inductor-capacitor LC phase shift circuit connected to supply said modulated signals to said resonant circuit at a phase shifted angle of substantially 90° independent of said primary winding;
   first and second oppositely polarized diodes connected to each end of said resonant circuit; and
   a capacitor network connected across said diodes for receiving charging currents proportional to the frequency of said modulated signals.

2. The demodulator of claim 1 wherein said modulated signals are supplied by a differential amplifier having two outputs connected to said phase shift circuit and said primary winding.

3. A demodulator as claimed in claim 1, wherein the LC-phase-shifting network is in the form of a high-pass filter having a capacitor at its input.

4. A bridge circuit demodulator for demodulating frequency-modulated signals having a predetermined carrier frequency, comprising:
   parallel resonant circuit means tunable to said carrier frequency and comprising a capacitor, and a secondary winding connected in parallel to said capacitor, said secondary winding having a tap, said parallel resonant circuit means constituting a first diagonal of said bridge circuit;
   a primary winding closely coupled to said secondary winding;

a phase shift circuit having a phase shift output connected to said tap of said secondary winding and a phase shift input, said phase shift circuit shifting a signal applied thereto by 90°;

means for interconnecting said parallel resonant circuit means and said phase shift circuit to constitute diagonals of a bridge circuit; and means for applying a first and second signal corresponding to said carrier frequency signal to said primary winding and said phase shift circuit input, respectively, said second signal having a phase independent of the tuning of said parallel resonant circuit means.

5. A demodulator as claimed in claim 4, wherein said applying means comprises a differential amplifier having an input receiving said frequency modulated signal, and a first and second output connected to said primary winding and said phase shift circuit, respectively.

6. A demodulator as claimed in claim 4, wherein said applying means comprises an amplifier element having a control electrode connected to receive said frequency modulated signal and connected to said phase shift input, and an output circuit connected to said primary winding.

7. A demodulator as claimed in claim 6, wherein said amplifier element is a transistor.

8. A demodulator as claimed in claim 4, wherein said phase shift circuit is a high-pass LC filter.

9. A demodulator as set forth in claim 4, wherein said phase shift circuit is a low-pass LC filter.

* * * * *